United States Patent

[11] 3,629,725

[72] Inventor Ping Sun Chun
Morris Township, Morris County, N.J.
[21] Appl. No. 888,019
[22] Filed Dec. 24, 1969
[45] Patented Dec. 21, 1971
[73] Assignee Bell Telephone Laboratories, Incorporated
Murray Hill, N.J.

[54] DRIVEN INVERTER WITH LOW-IMPEDANCE PATH TO DRAIN STORED CHARGE FROM SWITCHING TRANSISTORS DURING THE APPLICATION OF REVERSE BIAS
6 Claims, 3 Drawing Figs.

[52] U.S. Cl. .......... 331/113 A, 307/282, 330/15
[51] Int. Cl. .......... H03f 3/26, H03k 3/26
[50] Field of Search .......... 331/113 A; 321/2; 330/15, 14; 307/88, 282

[56] References Cited
UNITED STATES PATENTS

| | | | |
|---|---|---|---|
| 3,281,716 | 10/1966 | Brown | 331/113 A |
| 3,317,856 | 5/1967 | Wilkinson | 331/113 A |
| 3,323,075 | 5/1967 | Lingle | 331/113 A |
| 3,461,405 | 8/1969 | Bishop et al. | 331/113 A |

*Primary Examiner*—Roy Lake
*Assistant Examiner*—Siegfried H. Grimm
*Attorneys*—R. J. Guenther and E. W. Adams, Jr.

ABSTRACT: The base drive paths of the two switching transistors in a push-pull type inverter are magnetically coupled by a saturating magnetic core. Until saturation of the core occurs, the base-emitter voltage of the on-going switching transistor is clamped at a sufficiently low value to prohibit turn-on of the transistor. Thus turn-on of the on-going transistor is delayed. Each base drive path includes an impedance in series with the base during conduction to limit stored charge in the transistor base region, as well as a reverse-bias low-impedance discharge path to allow the stored charge in the off-going transistor to dissipate during the delay interval.

INVENTOR
P. S. CHUN
BY Alfred G. Steinmetz
ATTORNEY

DRIVEN INVERTER WITH LOW-IMPEDANCE PATH TO DRAIN STORED CHARGE FROM SWITCHING TRANSISTORS DURING THE APPLICATION OF REVERSE BIAS

BACKGROUND OF THE INVENTION

This invention relates to a semiconductor inverter circuits and more particularly to push-pull type inverter circuits which include circuitry to prevent overlapping in the conduction of oppositely phased switching transistors in the inverter.

The typical push-pull inverter circuit has two transistors connected in a common emitter connection. The collectors of the transistors are connected to an output transformer which is coupled to a load circuit. During one half of the operating cycle one of the transistors is conducting in its saturated region and the other transistor is nonconducting. In the subsequent half of the operating cycle the one transistor is nonconducting while the other transistor is conducting in its saturated region. The transistor can be biased from its nonconducting state to its saturated state quite rapidly. This time is known as the turn-on time. The speed at which the transistor can be biased from its saturated state to its nonconducting state is slower, being limited by the charge stored in the base region while in saturation. The time necessary to exhaust this stored charge is known as the storage time. During the storage time a reverse base current flows in the transistor. The storage time is influenced by the levels of both the forward and reverse base currents of the transistor. A high forward current increases, whereas a high reverse current decreases stored charge and hence storage time.

Due to the effects of the storage time, a condition may occur in the switching of the inverter in which the off-going transistor will continue conducting due to its stored charge beyond the time when the on-going transistor begins to conduct. This condition, in which the conduction periods of both transistors overlap, is known as switch-through.

Switch-through is a very undesirable condition in the operation of a push-pull type inverter. During periods of simultaneous conduction of the two switching transistors, large collector currents tend to flow which are limited only by the small collector to emitter impedances of the transistors. A high dissipation of power occurs and the transistors may overheat and be destroyed.

The power dissipation loss in the switching transistors, occurring because of the switch-through condition, increases directly with an increase in frequency. At very high frequencies this power dissipation becomes the chief source of transistor loss in the inverter circuit. In order to reduce this power dissipation loss it is necessary to eliminate the condition of switch-through.

Many circuit arrangements have been devised to reduce or eliminate this condition of switch-through in driven inverter circuits. These circuit arrangements generally delay the turn-on of the conducting transistor or use a temporary large reverse bias to expedite the dissipation of the stored charge.

In one particular arrangement disclosed by John D. Bishop et al. in U.S. Pat. No. 3,461,405, issued Aug. 12, 1969, saturable magnetic core signal delay circuits are placed in series with the base drive leads of the switching transistors. This delay circuit arrangement introduces a delay in the positive-going leading edge of the square wave voltage driving the transistor being turned on. This delay is sufficient to permit the stored charge in the off-going transistor to dissipate. A secondary winding is coupled to each of the saturable magnetic cores. A diode is connected across the secondary winding. The diode is poled to present an effective open circuit to the turn-on bias signals and to present a short circuit to the turn-off bias signals. Therefore the magnetic core exhibits saturable characteristics only in response to the positive-going square wave voltage to turn on the on-going transistor. The bias signal to turn off the transistor is applied to its base lead without delay and dissipation of the stored charge begins instantly. This particular arrangement is limited in that no provision is made to restrict the level of the forward current applied to the base of the conducting transistor. As a result, the charge stored in the base region of the transistor may become excessive. Due to this excessive stored charge the storage time is large and the condition of switch-through may still occur.

It is an object of the invention to reduce the possibility of switch-through in transistor inverter circuits.

It is another object of the invention to delay the application of biasing signals to on-going switching transistors by temporarily applying a voltage drop serially between the bias source and the switching transistors.

It is another object of the invention to restrict to a minimal value the charge stored in the base regions of the conducting transistors by limiting the level of base current applied to the switching transistors.

It is yet another object of the invention to expedite the dissipation of stored charge from the off-going switching transistors by the immediate application of a turn-off signal through a low-impedance discharge path.

SUMMARY OF THE INVENTION

The above objects of the invention are achieved by including a base drive dwell network in the base circuits of the switching transistors to delay the application of the turn-on bias current to the on-going switching transistor. The possibility of the occurrence of switch-through is further reduced by designing the dwell network to function as a current-limiting path for the base current delivered to the conducting transistor, while also functioning as a low-impedance discharge path to facilitate the dissipation of stored charge from the off-going transistor during the switching interval.

In one particular embodiment of the invention, these objects are achieved in a driven-type switching inverter circuit by including mutually coupled saturating reactor windings in the respective base drive paths of the two switching transistors. The mutual coupling of the reactor windings is utilized to introduce a voltage drop into the base drive path of the on-going switching transistor to temporarily delay its being biased into conduction. Upon saturation of the saturating reactor, this voltage drop is removed from the base drive path and the on-going switching transistor is consequently biased into conduction. The time delay until the reactor saturates is sufficient to permit the stored charge in the off-going switching transistor to dissipate through a low-impedance discharge path.

During the conduction interval, the level of the forward base current applied to the conducting transistor is limited by an impedance in series with the base, thus restricting the charge stored in the base region of this transistor to a minimal value. Simultaneously, the nonconducting transistor is biased in a nonconducting state by a continuous reverse-bias signal applied to its base.

The low-impedance discharge path is included in each of the base drive circuits of the two switching transistors to expedite the removal of stored charge in the off-going switching transistor at the moment it is biased into nonconduction. This advantageously prevents simultaneous conduction of current in the two switching transistors.

BRIEF DESCRIPTION OF THE DRAWING

Many additional objects, advantages and features of the invention may be ascertained by reference to the accompanying drawings and the following description in which FIG. 1 is a schematic diagram of a push-pull type driven inverter having dwell networks and low-impedance paths in the base drive paths of the two switching transistors to prevent the occurrence of switch-through;

FIG. 2 is another embodiment of a push-pull type driven inverter embodying similar principles to prevent switch-through.

DETAILED DESCRIPTION

Figure 1:
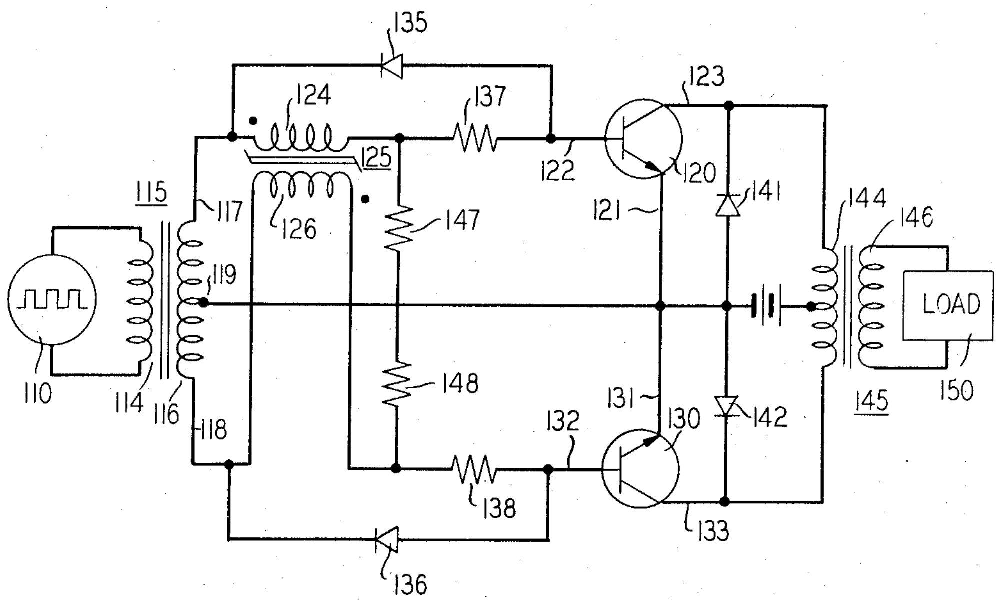

In the driven push-pull type inverter illustrated in FIG. 1 the driving energy is obtained from the pulse signal source 110. This driving energy is in the form of a square wave bias voltage which is applied to the primary winding 114 of the input transformer 115. The switching of the transistors 120 and 130 occurs in response to the opposite polarities of the square wave drive voltage. The actual base drive signal is derived from the center-tapped secondary winding 116. As the transistors 120 and 130 are alternately biased into conduction an output current respectively flows through the opposite halves of the center-tapped primary winding 144 of the output transformer 145. The resulting transformed voltage in the secondary winding 146 supplies the energy applied to the load circuit 150.

The base drive networks of the two transistors 120 and 130 include the saturating reactor windings 124 and 126, respectively. These windings are mutually coupled by being wound on a common saturating magnetic core 125. The windings 124 and 126 and the base drive impedances 137 and 138 are shunted by the diodes 135 and 136 to provide a low-impedance discharge path to permit the rapid elimination of the stored charge during the turn-off period of the switching transistors.

The principles of the invention may be readily apprehended by describing a typical cycle of operation of the inverter circuit illustrated in FIG. 1. The square wave base drive signal, for the switching transistors 120 and 130 of the inverter, is derived from the pulse signal source 110. Any typical pulse signal source having a square waveform will be satisfactory for use in the present circuit. For the purposes of illustrating the principles of the invention, it is assumed that the transistor 120 is initially biased in its nonconducting state and that the transistor 130 is conducting in its saturated state. The square wave voltage supplied to the network by pulse signal source 110 has just changed polarity from its negative polarity to its positive polarity. The terminal lead 117 of the secondary winding 116 is positive with respect to terminal lead 118. The voltage at the center-tap terminal lead 119 lies half way between the voltages at terminal leads 117 and 118. The positive base drive signal at the terminal lead 117 is applied across the series combination of the winding 124, the resistors 147 and 148, and the winding 126. The voltage appearing across resistor 147 is applied across the series connection of resistor 137 and the base-emitter junction of transistor 120.

The winding 124 is coupled, via the saturating magnetic core 125 to the winding 126. The winding 126 is connected to the resistor 138 and the diode 136 forming therefrom a closed current circulating loop. The voltage drop included in this loop produced by the circulating current through resistor 138 and diode 136 is coupled by transformer action into the winding 124, which is in the base drive circuit of the transistor 120. Hence a voltage drop is presented to the positive going square wave voltage applied to the base 122 of transistor 120. The voltage drop is sufficient to absorb most of the base drive signal voltage occurring between the leads 117 and 119. Hence at this interval of time the remaining drive voltage appearing across resistor 147 and therefore across the base-emitter junction of transistor 120 is insufficient to bias it into conduction.

During this interval of time the base-emitter junction of the transistor 130 is subjected to a reverse-bias voltage determined by the voltage drop of resistor 148. This reverse-bias voltage is utilized to sweep stored charge from the base-emitter junction of the off-going transistor 130 during the initial portion of the delay interval. The sweepout current due to this reverse voltage flows from lead 119 to emitter 131, base 132, and through the diode 136 and back to the lead 118. The reverse voltage coupled with the low-impedance discharge path of the diode 136 rapidly eliminates the stored charge of the off-going transistor 130. This insures that the current traversing the collector-emitter path of transistor 130 will completely decay to zero before the end of the delay interval.

At the end of the delay interval the core 125 saturates and the transformer action between the windings 124 and 126 ceases to operate. The voltage drop across the winding 124 is removed from the base drive circuit of transistor 120 and hence sufficient voltage is applied to the base-emitter junction of transistor 120 to bias it into conduction. During the remainder of the half-cycle the transistor 120 receives sufficient base drive to keep it in its saturated conducting state. The base-emitter junction of the transistor 130 is reverse biased and transistor 130 remains nonconducting.

When the output square wave voltage of the pulse signal source 110 changes polarity the reverse action occurs and a subsequent delay interval is introduced into the base drive response of the transistor 130. The stored charge in transistor 120 during the subsequent half-cycle will be rapidly discharged through a low-impedance path comprising the diode 135 until saturation in the saturating core 125 occurs. At this point the transistor 130 will be biased into conduction and remain conducting for the remainder of the half-cycle.

The output signal to the load circuit 150 is derived from the alternating circulating currents traversing the upper and lower portions of the primary winding 144 in response to conduction in the transistors 120 and 130. These currents are coupled by the output transformer 145 to the secondary winding 146 and from thence to the load 150.

The diodes 141 and 142 shunt the collectors 123 and 133 of the transistors 120 and 130. The diodes 141 and 142 transmit inverse out-of-phase currents to bypass the switching transistors when they are nonconducting. The resistors 147 and 148, in addition to their biasing function, provide a current path for the magnetizing current flowing through the windings 124 and 126 prior to saturation of magnetic core 125.

Figure 2:
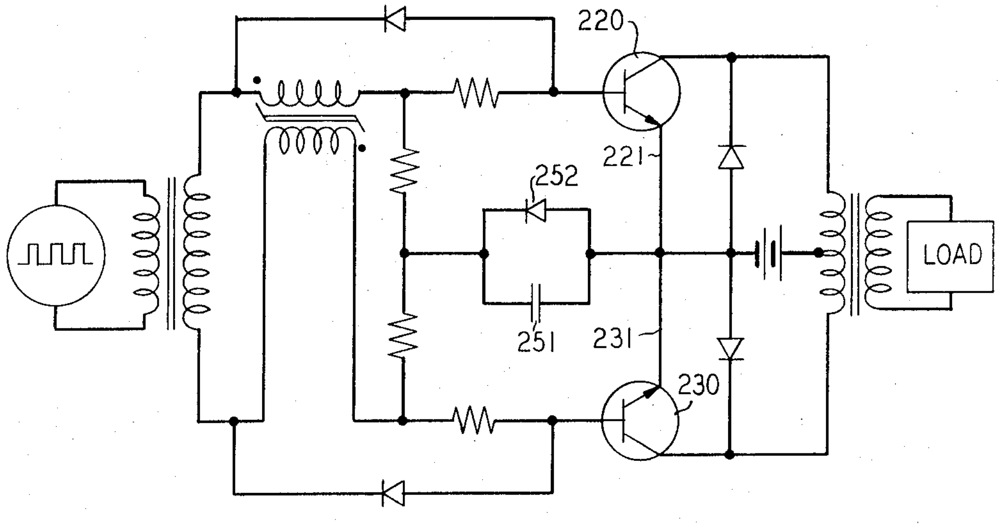

FIG. 2 discloses a variation of the embodiment of the invention shown in FIG. 1. The circuit in FIG. 2 operates similarly to that disclosed in FIG. 1 and hence a detailed description of its operation is not believed necessary. A capacitor 251 is added to the circuit and coupled to the emitters 231 and 221 of the transistors 230 and 220. This capacitor 251 is shunted by a diode 252 to control its voltage drop. When either one of the transistors 220 or 230 is conducting a charge is stored on the capacitor 251. When the transistor is biased into its nonconducting state, the voltage due to the charge stored on the capacitor 251 acts as a reverse-bias assist voltage to additionally assist in sweeping out the stored charge in the base-emitter junction of the transistor being biased into its nonconducting state.

Figure 3:
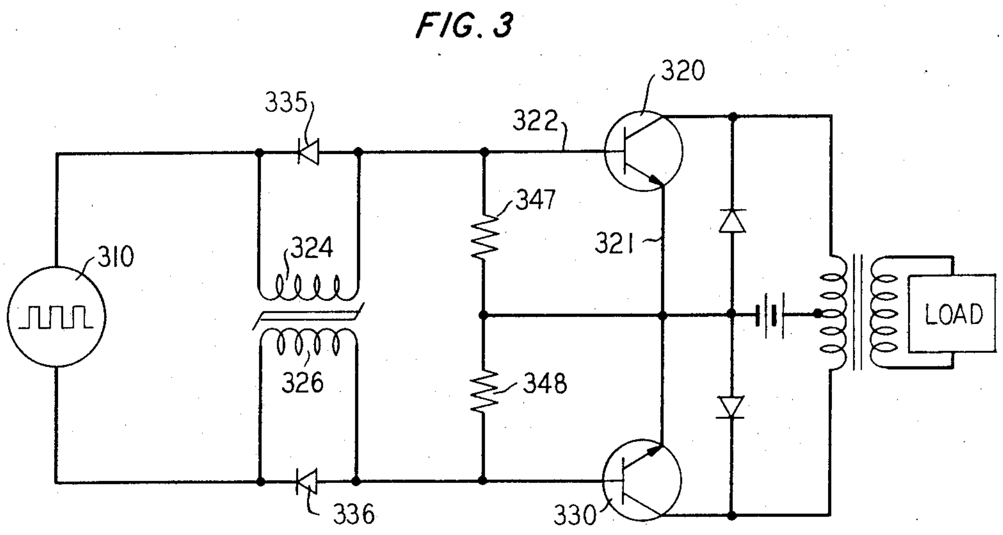
FIG. 3 is yet another embodiment of a push-pull type driven inverter embodying the principles of the invention.

Another embodiment of the invention as disclosed in FIG. 3 may be utilized where the forward voltage drop produced by the diodes 335 and 336 is sufficient to prevent the transistors 320 and 330 from being biased into conduction. The impedance to limit the base drive current of the transistors 320 and 330 is provided by resistors 348 and 347, respectively. The forward base drive current for transistor 320 would originate at the source 310 and traverse the winding 324, the base 322, the emitter 321, the resistor 348 and return to the source 310. It is not believed necessary to describe the operation of this circuit in detail since it is similar to the operation of the inverter circuits disclosed above.

While the principles of the invention have been described with reference to driven inverters, it is to be understood that these principles are equally applicable to prevent switch-through in free-running inverters.

What is claimed is:

1. In an inverter circuit comprising a driving source having two output terminals of opposite polarity, a pair of alternately conducting switching transistors including base collector and emitter electrodes and a pair of base drive circuits connected to said two terminals respectively to permit the alternate application of a turn-on voltage to said base electrodes, a saturating transformer including a pair of magnetically coupled winding, each of said windings being serially connected in one of said base drive circuits, whereby said coupled windings magnetically couple said pair of base drive circuits, low-impedance discharge paths shunting each of said base drive circuits including said windings, said low-impedance discharge paths conditionally controlled to conduct currents in one direction, the one direction oriented to transmit currents due to stored charge in said switching transistors, an output circuit, and means to couple said switching transistors to said output circuit, whereby the added voltage drop due to the reflected impedance added to a base drive circuit from the other base drive circuit due to said magnetic coupling before saturation of said saturating transformer prevents the turn-on of a switching transistor until the stored charge in the other switching transistor has discharged through said low-impedance discharge path.

2. An inverter circuit as defined in claim 1 further including a charge storage capacitor connected to a common node connecting the emitter junctions of the switching transistors whereby the voltage due to charge stored thereon provides a reverse voltage to help dissipate stored charge in the switching transistors.

3. A driven inverter circuit comprising a source of energy including two terminals of opposite polarity, first and second alternately conducting switching transistors including first and second control electrodes coupled to the two terminals of opposite polarity of said source of energy, respectively, first and second coil windings mutually coupled by being wound on a common saturating reactor core and serially interconnecting said first and second control electrodes to the two terminals of opposite polarity of said source of energy, respectively, first and second impedances connected to said first and second coil windings and shunting said first and second switching transistors to generate bias control voltages, first and second low-impedance unidirectional conducting paths connected in parallel with said first and second coil windings, respectively, and poled in a direction opposite the direction of the turn-on biasing current transmitted to said first and second control electrodes, an output circuit, and means to couple said switching transistors to said output circuit, whereby the mutually coupled winding introduce an added voltage drop in series with the control electrode to delay the turn-on of the switching transistors and said low-impedance conducting path permits the rapid discharge of stored charge in said switching transistors to prevent simultaneous conduction in said first and second switching transistors.

4. A driven inverter circuit as defined in claim 3 wherein a first and second resistance are included in series with said first and second coil windings to limit the signals applied to the first and second control electrodes of said first and second switching transistors by said source of energy and said first and second low-impedance conducting paths bypass said first and second resistances, respectively.

5. A driven inverter circuit comprising a first and a second switching transistor each including a control electrode and an output electrode, an output circuit, means to couple the output electrodes of said first and second switching transistors to said output circuit, a source of driving energy including a first and second terminal, a saturating magnetic core, a first transmission path coupling the first terminal of said source of energy to the control electrode of said first transistor, a second transmission path coupling the second terminal of said source of energy to the control electrode of said second transistor, said first and second transmission paths each including a first and second coil winding, respectively, said first and second coil windings being wound on said saturating magnetic core and said first and second transmission path each including a first and second impedance, respectively, to limit the current therein, a first discharge path coupling the first terminal of said source of energy to the control electrode of said first transistor, a second discharge path coupling the second terminal of said source of energy to the control electrode of said second transistor, said first and second discharge paths each including a diode poled to conduct only signals which will reverse bias said first and second transistors whereby said coil windings introduce an added voltage drop into said first and second transmission paths to prevent said first and second transistors from being biased into conduction until said saturating magnetic core saturates and said added voltage drop is removed and said first and second discharge paths expedite the removal of stored charge from said first and second transistors so that the stored charge is exhausted before said saturating magnetic core saturates.

6. A driven inverter as defined in claim 5 further including a shunt resistance path connecting said first and second transmission paths and connecting the control electrodes of said first and second switching transistors to establish the voltage drop to bias the first and second transistors into conduction after saturation has occurred.

* * * * *